March 17, 1959 WOO F. CHOW ET AL 2,878,386

STABLE TRANSISTOR OSCILLATOR

Filed Feb. 26, 1957

INVENTOR:
WOO F. CHOW,
DONALD A. PAYNTER,
BY Robert J. Steinmeyer
THEIR ATTORNEY

United States Patent Office 2,878,386

Patented Mar. 17, 1959

2,878,386

STABLE TRANSISTOR OSCILLATOR

Woo F. Chow and Donald A. Paynter, Syracuse, N. Y., assignors to General Electric Company, a corporation of New York Application February 26, 1957, Serial No. 642,429

5 Claims. (Cl. 250—36)

Our invention relates to stable transistor oscillators and more particularly to transistor oscillators employing series resonant L-C circuits for stabilization.

In the prior art it has been conventional to stabilize oscillators by the use of inductor (L) and capacitor (C) circuits for moderate degrees of stability, and by the use of non-linear components such as crystals where the need for a greater degree of stability justifies the expense.

Both series and parallel L-C circuits have been used to stabilize oscillators. Among the circuits employing series L-C resonance is an oscillator described by J. K. Clapp in his article "An inductance-capacitance oscillator of unusual frequency stability," Proceedings of the I. R. E., vol. 36, p. 356, March 1948. Various modifications employing series L-C resonant combinations have also been devised.

In stabilizing the frequency of a transistor oscillator with L-C combinations it is desirable that the values of the external inductances and capacitances control the frequency of oscillation to the substantial exclusion of variations in the transistor parameters or the oscillator supply voltage. Since L-C components can be made very stable, a high degree of frequency stability can then be achieved without the use of elaborate non-linear compensation techniques.

Accordingly, it is a principal object of our invention to provide a stable transistor oscillator.

Another object of our invention is to provide a transistor oscillator having a high degree of stability without necessitating the use of non-linear circuit elements.

A further object of our invention is to provide a stable transistor oscillator employing series resonant L-C networks.

A still further object of our invention is to provide a stable transistor oscillator employing series resonant L-C networks which will provide a higher degree of stability than has been heretofore obtainable by the use of such networks.

In carrying out our invention in one form thereof, a transistor having base, emitter and collector electrodes is connected in common emitter configuration and provided with proper biasing means in order to establish a stable D. C. operating point. A series resonant L-C network is connected from the transistor emitter electrode to a common point. The values of inductance and capacitance in this network are selected in order to insure oscillation in the circuit. A second series L-C network is connected from the transistor base electrode to the common point. The combined values of inductance and capacitance in the two series resonant L-C networks determine the frequency of oscillation of the transistor oscillator circuit to the substantial exclusion of variations in supply voltage and transistor parameters resulting from temperature changes and other effects.

Figure 1:
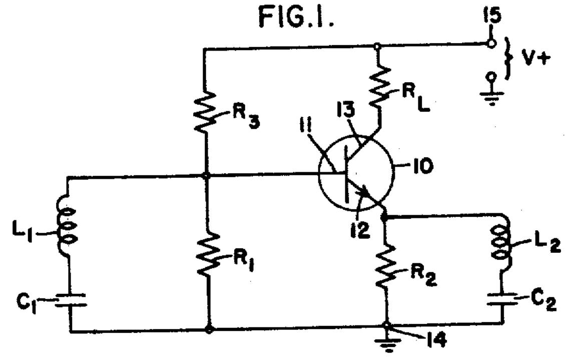
Figure 2:
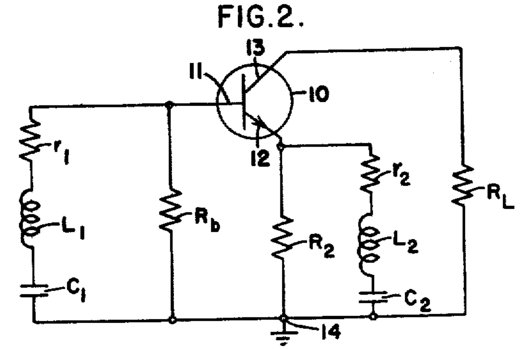
Figure 3:
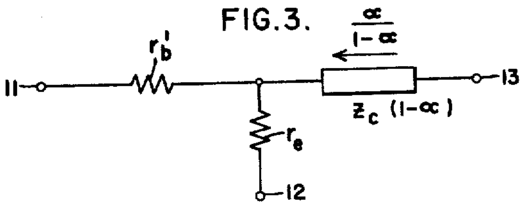
Figure 4:
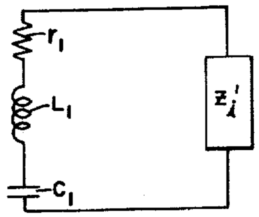

The novel features which we believe to be characteristic of our invention are set forth with particularity in the appended claims. Our invention itself, however, together with further objects and advantages thereof, can best be understood by reference to the following description taken in connection with the accompanying drawing in which Fig. 1 is a circuit diagram illustrating one embodiment of our invention; Fig. 2 is a circuit diagram similar to the circuit of Fig. 1 in a form modified for facilitating an impedance analysis of the circuit; Fig. 3 is the T-equivalent circuit of the transistor shown in Figs. 1 and 2; and Fig. 4 is a simplified equivalent circuit of the circuit of Fig. 2.

Referring now to the drawings, in Fig. 1 we have shown an NPN transistor 10 having base electrode 11, emitter electrode 12 and collector electrode 13. An emitter biasing resistor $R_2$ is connected between emitter electrode 12 and a common point 14 which may be maintained at ground potential as indicated. A base biasing resistor $R_1$ is connected between base electrode 11 and common point 14. A load impedance $R_L$ is connected between collector electrode 13 and terminal 15, terminal 15 being connected to a source of potential V+, the other side of which is connected to ground. Dropping or voltage dividing resistor $R_3$ is connected between base electrode 11 and terminal 15. An inductor $L_2$ and a capacitor $C_2$ are connected in series across emitter biasing resistor $R_2$ and an inductor $L_1$ and capacitor $C_1$ are connected in series across base biasing resistor $R_1$.

The circuit of Fig. 1 illustrates one embodiment of the tuned emitter, tuned base oscillator of our invention. The D. C. circuit includes the four resistors $R_1$, $R_2$, $R_3$, and $R_L$ and the voltage supply V+. The values of these resistances can be selected on the basis of standard amplifier design procedure, subject to the modifications which will appear later in the analysis of the oscillator circuit. This resistor configuration is suitable for good D. C. stabilization. The two series tuned L-C networks, comprising inductor $L_1$ and capacitor $C_1$ and inductor $L_2$ and capacitor $C_2$ respectively, form the resonant elements of the oscillator network. Oscillation will occur when the negative resistance present from base 11 of transistor 10 to the common terminal 14 is sufficient to cancel the losses in the resonant circuit formed by inductor $L_1$ and capacitor $C_1$.

Turning now to Fig. 2, we have shown the circuit of Fig. 1 re-drawn to facilitate a mathematical analysis. Resistances $r_1$ and $r_2$ are the internal loss resistances of $L_1$ and $L_2$ respectively and $R_b$ is given by $$\frac{R_1R_3}{R_1+R_3}$$

where $R_1$ and $R_3$ are the same as indicated in Fig. 1. The remainder of the circuit differs from the circuit of Fig. 1 only in that the source of voltage is not shown.

The impedance $Z_1$ in the base circuit externally between base electrode 11 and common point 14 is given by $$Z_1=\frac{R_b\left[r_1+j\left(\omega L_1-\frac{1}{\omega C_1}\right)\right]}{R_b+r_1+j\left(\omega L_1-\frac{1}{\omega C_1}\right)} \quad (1)$$

The impedance $Z_2$ in the emitter circuit between emitter electrode 12 and common point 14 is given by $$Z_2=\frac{R_2\left[r_2+j\left(\omega L_2-\frac{1}{\omega C_2}\right)\right]}{R_2+r_2+j\left(\omega L_2-\frac{1}{\omega C_2}\right)} \quad (2)$$

Consider the T-equivalent circuit for transistor 10 as shown in Fig. 3, where $r_b'$ represents the transistor equivalent base resistance at high frequencies, $r_e$ represents the emitter resistance, $Z_c$ represents the collector impedance and $\alpha$ represents the current gain. Since $Z_2$, of Equation 2, is in series with the emitter resistance $r_e$ the input impedance $Z_i$ of the common emitter stage is $$Z_i=\frac{\Delta^z+(r'_b+r_e+Z_2)R_L}{r_e+Z_2+Z_e(1-\alpha)+R_L} \tag{3}$$

where $$\Delta^z=(r'_b+r_e+Z_2)[r_e+Z_2+Z_e(1-\alpha)]-(r_e+Z_2)(r_e+Z_2-\alpha Z_e) \tag{4}$$

with $$Z_e\cong\frac{r_e}{1+j\omega C_e r_e} \tag{5}$$

and $$\alpha\cong\frac{\alpha_0}{1+j\frac{\omega}{\omega_\alpha}} \tag{6}$$

where $\alpha_0$= the low frequency $\alpha$ and $\omega_\alpha=2\pi f_\alpha$, where $f_\alpha$ is the $\alpha$ cutoff frequency which is the frequency at which $\alpha$ is 3 db below its low frequency value $\alpha_0$.

When the frequency is near the resonant frequency $f_0$ of $L_1\times C_1$ and $L_2\times C_2$, the effect of $R_b$ and $R_2$ can be neglected, thus $$Z_1\cong r_1+j\left(\omega L_1-\frac{1}{\omega C_1}\right) \tag{7}$$

$$Z_2\cong r_2+j\left(\omega L_2-\frac{1}{\omega C_2}\right) \tag{8}$$

Combining Equations 3, 4, 5, 6 and 8 and simplifying the result by assuming $R_L$ is of the order of $10^3$ ohms and $$R_L\omega C_e\ll\frac{\omega}{\omega_\alpha}$$

we have $$Z_i\cong\left(\frac{\omega_\alpha}{\omega}\right)\left[\left(\omega L_2-\frac{1}{\omega C_2}\right)+(r'_b+r_e+r_2)\left(1+\frac{\omega}{\omega_\alpha}\right)\right]+j\left[\left(\omega L_2-\frac{1}{\omega C_2}\right)-\frac{\omega_\alpha}{\omega}(r_e+r_2)\right] \tag{9}$$

A simplification of the circuit of Fig. 2 is shown in Fig. 4 from which the loop impedance is $$r_1+\frac{\omega_\alpha}{\omega}\left[\left(\omega L_2-\frac{1}{\omega C_2}\right)+(r'_b+r_e+r_2)\left(1+\frac{\omega}{\omega_\alpha}\right)\right]+j\left(\omega L_1+\frac{1}{\omega C_1}\right)+j\left[\left(\omega L_2-\frac{1}{\omega C_2}\right)-\frac{\omega_\alpha}{\omega}(r_e+r_2)\right] \tag{10}$$

At the resonant frequency of the entire circuit of Fig. 4

$$\omega L_1-\frac{1}{\omega C_1}+\omega L_2-\frac{1}{\omega C_2}-\frac{\omega_\alpha}{\omega}(r_e+r_2)=0$$

or $$\omega L_1-\frac{1}{\omega C_1}+\omega L_2-\frac{1}{\omega C_2}=\frac{\omega_\alpha}{\omega}(r_e+r_2) \tag{11}$$

In order to produce oscillation a negative resistance in the impedance $Z_i$ must exist. Thus $$\omega L_2-\frac{1}{\omega C_2}+(r_b'+r_e+r_2)\left(1+\frac{\omega}{\omega_\alpha}\right)<0$$

or $$\frac{1}{\omega C_2}>\omega L_2+(r_b'+r_e+r_2)\left(1+\frac{\omega}{\omega_\alpha}\right) \tag{12}$$

In order to maintain oscillation $$\frac{\omega_\alpha}{\omega}\left(\frac{1}{\omega C_2}\right)\geq\left[r_1+\omega_\alpha L_2+(r_b'+r_e+r_2)\left(1+\frac{\omega}{\omega_\alpha}\right)\right] \tag{13}$$

From Equation 11 we have the frequency of oscillation $$\omega=\sqrt{\frac{\omega_2(r_e+r_2)+\frac{1}{C_1}+\frac{1}{C_2}}{L_1+L_2}} \tag{14}$$

If $\omega_\alpha(r_e+r_2)$ is negligible then $$\omega=\frac{1}{\sqrt{(L_1+L_2)\left(\frac{C_1C_2}{C_1+C_2}\right)}} \tag{15}$$

Thus, the frequency of oscillation is very nearly the resonant frequency of the circuit formed by the series connection of $L_1$, $L_2$, $C_1$, and $C_2$ and the circuit will oscillate provided that $L_2$ and $C_2$ are chosen according to the condition stated in Equation 13.

One set of values for the embodiment shown in Fig. 1 illustrating a typical operational design is as follows:

| | | |
|---|---|---|
| $R_1=R_2=R_3$ | ohms | 10K |
| $R_L$ | do | 5.1K |
| $L_1=L_2$ | μh | [1] 200 to 500 |
| $C_2$ | μμf | 110 |
| $C_1$ | μμf | 510 |
| V+ | volts | 20 |
| Transistor 10 | | 2N78 |

[1] Variable.

The inductances of inductors $L_1$ and $L_2$ are adjusted for the desired frequency and the amount of feedback, as is indicated by good sinusoidal output at the transistor collector 13. The stability with respect to supply voltage variations of the above circuit is of the order of 7 parts per million per 12% variation of voltage. This degree of stability is a considerable improvement over the stability of the above-mentioned Clapp oscillator for instance, which in its transistorized form is of the order of 200 to 400 parts per million for a 10% variation in supply voltage as specified by E. Keonjian in his article "Stable transistor oscillator," IRE Transactions of PGCT, vol. CT-3, No. 1, p. 38, March 1956.

The above circuit analysis and comparison with the corresponding Clapp oscillator show that the series-tuned base, series-tuned emitter transistor-oscillator of the present invention is capable of producing A. C. voltages of excellent frequency stability without the use of non-linear compensation techniques.

It will be obvious to those skilled in the art that other biasing configurations can be used employing at the same time the circuitry of our invention. Thus, while we have shown a particular embodiment of our invention, it will be understood, of course, that we do not wish to be limited thereto since many modifications may be made and we therefore contemplate by the appended claims to cover any such modifications as fall within the true spirit and scope of our invention.

What we claim as new and desire to secure by Letters Patent of the United States is:

1. A series tuned transistor oscillator comprising a transistor having base, emitter and collector electrodes, biasing means connected to said transistor electrodes for establishing a stable direct current operating point for said transistor, a series tuned inductance-capacitance network connected from said emitter to a common point, a load impedance connected from said collector electrode through a source of potential to said common point, said load impedance being small compared with the output impedance of said transistor, and a series tuned inductance-capacitance network connected from said base electrode to said common point, whereby the frequency of oscillation of said oscillator will be substantially determined by said series tuned inductance-capacitance networks.

2. A series tuned transistor oscillator comprising a transistor having base, emitter and collector electrodes, biasing means connected to said transistor electrodes for establishing a stable direct current operating point for said transistor, a series tuned inductance-capacitance network connected from said emitter electrode to a common point, said inductance-capacitance network providing a capacitive reactance which is large at the frequency of oscillation compared with its inductive reactance and the input resistive components of said transistor, a load impedance connected from said collector electrode through a source of potential to said common point, said load impedance being small compared with the output impedance of said transistor and a series tuned inductance-capacitance network connected from said base electrode to said common point whereby the effect of variations of transistor parameters on the frequency of oscillation of said oscillator are minimized, said frequency being substantially determined by said series tuned inductance-capacitance networks.

3. A series tuned transistor oscillator comprising a transistor having base, emitter and collector electrodes, biasing means connected to said transistor electrodes for establishing a stable direct current operating point for said transistor, a first inductor and a first capacitor connected in series from said emitter electrode to a common point, said first capacitor being small enough to provide a capacitive reactance which is large at the frequency of oscillation compared to the combined impedance of said first inductor and the input resistive components of said transistor, a load impedance connected from said collector electrode through a source of potential to said common point, said load impedance being small compared with the transistor output impedance, and a second inductor and a second capacitor connected in series from said base electrode to said common point whereby the combined values of said inductors and capacitors determine the frequency of oscillation of said oscillator.

4. A series tuned transistor oscillator comprising a transistor having base, emitter and collector electrodes; a source of direct current potential; a base biasing resistor connected between said base electrode and one terminal of said source; an emitter biasing resistor connected between said emitter electrode and said one terminal; a load impedance connected between said collector electrode and the other terminal of said source, said load impedance being small compared with the output impedance of said transistor; a voltage dividing resistor connected between said base electrode and said other terminal; a series tuned inductance-capacitance network connected across said base biasing resistor; and a series tuned inductance-capacitance network connected across said emitter biasing resistor, said emitter inductance-capacitance network providing a capacitive reactance which is large at the frequency of oscillation compared with its inductive reactance and the input resistive components whereby the values of the two series tuned inductance-capacitance networks determine the frequency of oscillation to the substantial exclusion of the variation in transistor parameters.

5. A series tuned transistor oscillator comprising a transistor having base, emitter, and collector electrodes, a source of direct current potential, resistance means connected between said transistor electrodes and said source for establishing a stable direct current operating point for said transistor, a load impedance connected from said collector electrode through a source of potential to said common point, a series tuned inductance-capacitance network connected from said emitter to said common point, said emitter network proportioned to have a net capacitive reactance so as to present a negative input resistance between said base and said common point, a series tuned inductance-capacitance network connected from said base to said common point so as to oscillate in conjunction with said negative input resistance, the inductance-capacitance values of said series tuned circuits determining the frequency of oscillation to the substantial exclusion of variations in transistor parameters.

References Cited in the file of this patent

UNITED STATES PATENTS

| | | |
|---|---|---|
| 1,896,781 | Llewellyn | Feb. 7, 1933 |
| 2,382,954 | Beaudoin | Aug. 21, 1945 |
| 2,438,382 | Born | Mar. 23, 1948 |
| 2,750,508 | Waldhaur | June 12, 1956 |